US006920621B1

(12) United States Patent
Toutounchi et al.

(10) Patent No.: US 6,920,621 B1
(45) Date of Patent: Jul. 19, 2005

(54) METHODS OF TESTING FOR SHORTS IN PROGRAMMABLE LOGIC DEVICES USING RELATIVE QUIESCENT CURRENT MEASUREMENTS

(75) Inventors: Shahin Toutounchi, Pleasanton, CA (US); Erik V. Chmelar, Midland, MI (US); Robert W. Wells, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 135 days.

(21) Appl. No.: 10/644,158

(22) Filed: Aug. 20, 2003

(51) Int. Cl.[7] .............................................. G06F 17/50
(52) U.S. Cl. ............................................ 716/4; 716/16
(58) Field of Search ........................... 716/4, 5, 16, 17

(56) References Cited

U.S. PATENT DOCUMENTS

| | | | | |
|---|---|---|---|---|
| 5,278,841 | A | | 1/1994 | Myers |
| 5,515,302 | A | * | 5/1996 | Horr et al. ................. 358/1.15 |
| 6,029,117 | A | * | 2/2000 | Devgan ....................... 702/58 |
| 6,449,751 | B1 | * | 9/2002 | Hussain et al. ................ 716/4 |
| 6,532,440 | B1 | * | 3/2003 | Boppana et al. .............. 703/14 |
| 6,594,610 | B1 | | 7/2003 | Toutounchi et al. |
| 6,678,645 | B1 | * | 1/2004 | Rajsuman et al. ............ 703/20 |
| 6,687,883 | B2 | * | 2/2004 | Cohn et al. .................... 716/4 |
| 6,732,309 | B1 | * | 5/2004 | Toutounchi et al. ........ 714/725 |

OTHER PUBLICATIONS

Chakravarty, S., et al., "IDDQ measurement based diagnosis of bridging faults in full scan circuits", Feb., 1993. Department of Computer Science, State University of New York at Buffalo, Technical Report No: 93–04. pp. 1–12.*

Rajsuman, R., "IDDQ testing for CMOS VLSI", Apr. 2000. IEEE, pp. 544–568.*

Rajsuman, R., "Design–for–IDDQ–testing for embedded cores based system–on–a–chip", Nov. 1998. IEEE, pp. 69–73.*

Chakravarty, S. et al., "Algorithms for current monitor based diagnosis of bridging and leakage faults", ACM/IEEE Design Automation Conference, pp. 353–356.*

Isern, E., et al., "IDDQ test and diagnosis of CMOS circuits". 1995. IEEE. pp. 60–67.*

U.S. Appl. No. 10/147,732, filed May 16, 2002, Trimberger.

* cited by examiner

Primary Examiner—Stacy A. Whitmore
(74) Attorney, Agent, or Firm—Lois D. Cartier

(57) ABSTRACT

Methods of testing for shorts (e.g., bridging defects) between interconnect lines in an integrated circuit. For example, in a design implemented in a programmable logic device (PLD), some interconnect lines are used and others are unused. To test for shorts between the used and unused interconnect lines, both used and unused interconnect lines are driven to a first logic level, and the leakage current is measured. The used interconnect lines are driven to a second logic level, while the unused lines remain at the first logic level. The current is again measured, and the difference between the two measurements is determined. If the difference exceeds a predetermined threshold, the device design combination is rejected. Some embodiments provide methods of testing for shorts between used and unused interconnect lines for a design targeted to a partially defective PLD.

25 Claims, 3 Drawing Sheets

METHODS OF TESTING FOR SHORTS IN PROGRAMMABLE LOGIC DEVICES USING RELATIVE QUIESCENT CURRENT MEASUREMENTS

FIELD OF THE INVENTION

The invention relates to programmable logic devices (PLDs). More particularly, the invention relates to methods of testing for shorts in PLDs using relative quiescent current measurements.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input output blocks (IOBs). Some FPGAs also include additional logic blocks with special purposes, e.g., DLLs, RAMs, processors, and so forth. The various logic blocks are interconnected by a programmable interconnect structure, which typically includes a large number of interconnect lines interconnected by programmable interconnect points (PIPS) and programmable switch matrices.

The interconnect structure and logic blocks are typically programmed by loading a stream of configuration data (a configuration bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

The interconnect structure of an FPGA can occupy a large proportion of the device, e.g., about fifty percent of the die area in some FPGAS. To provide flexibility for the implementation of designs, many more routing resources are typically provided than are needed for most designs. For example, a design targeted to an FPGA might use only about four percent of the available interconnect lines in the FPGA. Thus, there are typically a large number of unused interconnect lines present after loading a design into the FPGA. To prevent unwanted coupling effects and noise, the unused interconnect lines are typically pulled to a known logic level. For example, in the FPGAs provided by Xilinx, Inc., the unused interconnect lines are pulled to a logic high value.

One type of fabrication defect that can occur in integrated circuits (ICs) is a "bridging defect". A bridging defect is an unintentional connection between two interconnect lines (a "short"). Because the dimensions of IC structures are decreasing (including the minimum distance between interconnect lines), bridging defects are becoming more common in ICs. PLDs (including FPGAS) are no exception to this trend.

Clearly, where unused interconnect lines are tied to logic high, a bridging defect between used and unused interconnect lines results in a "stuck at one" fault on the used interconnect line. However, FPGA interconnect lines are typically interconnected through a series of NMOS transistor pass gates. As is well known, NMOS transistors pass a full logic low (zero) value, but only pass a diminished logic high (one) value. If logic in the design is driving a logic low value, but the bridging defect is supplying a logic high value, the stronger logic low value dominates and is reflected in the circuit output. However, undesirable coupling effects and noise are still present, and a low signal on the interconnect line might be undesirably delayed. Therefore, it is still desirable to detect the bridging defect in these circumstances. However, the diminished logic high value makes it difficult to detect the "stuck-at-one" condition in this example by using known Boolean methods.

One method of testing for bridging defects is referred to herein as the "wired-AND" test. In the wired-AND test, all unused interconnect lines are pulled to a logic low value, instead of a logic high value. In this instance, a bridging defect behaves as a "stuck-at-zero" fault. Because a logic low value is undiminished when passing through an NMOS pass gate, a "stuck-at-zero" condition is more easily detected using well known Boolean methods. However, in many commercially available FPGAS, it is difficult to apply a logic low value to the unused interconnect lines, because unused interconnect lines are pulled high by default.

As has been demonstrated, testing for shorts (e.g., bridging defects) in PLDs can be a complicated process when known methods are used. Therefore, it is desirable to provide improved methods for testing for shorts in PLDs.

SUMMARY OF THE INVENTION

The invention provides methods of testing for shorts (e.g., bridging defects) between interconnect lines in an integrated circuit. For example, in a design implemented in a programmable logic device (PLD), some interconnect lines are used and others are unused. To test for shorts between the used and unused interconnect lines, both used and unused interconnect lines are driven to a first logic level, and the leakage current is measured. The used interconnect lines are driven to a second logic level, while the unused lines remain at the first logic level. The current is again measured, and the difference between the two measurements is determined. If the difference exceeds a predetermined threshold, the device design combination is rejected. Some embodiments provide methods of testing for shorts between used and unused interconnect lines for a design targeted to a partially defective PLD.

One embodiment of the invention provides a method of detecting shorts between first and second sets of interconnect lines in a device. The method includes driving the first and second sets of interconnect lines to a first logic level; measuring a reference current IDDQref with the first and second sets of interconnect lines at the first logic level; driving the first set of interconnect lines to the first logic level and the second set of interconnect lines to a second logic level different from the first logic level; measuring a total leakage current IDDQtot with the first set of interconnect lines at the first logic level and the second set of interconnect lines at the second-logic level; determining a signature current IDDQsig equal to a difference between the IDDQtot and the IDDQref; rejecting the device if the IDDQsig exceeds a predetermined threshold; and passing the device if the IDDQsig does not exceed the predetermined threshold.

In some embodiments, the first and second sets of interconnect lines are sets of alternating interconnect lines. In other words, within an adjacent group of interconnect lines, one set includes the first, third, fifth lines, and so forth, while the other set includes the second, fourth, sixth lines, and so forth. These embodiments can be used to detect bridging defects in most devices, because only interconnect lines that are at least partially adjacent are susceptible to bridging defects.

Another embodiment of the invention provides a method of detecting shorts between used and unused interconnect lines in a design targeted to a PLD. The PLD includes used interconnect lines, which are interconnect lines in the PLD used in the design, and unused interconnect lines, which are interconnect lines in the PLD not used by the design. The method includes configuring the PLD with both used and unused interconnect lines being driven to a first logic level; measuring a reference current IDDQref with both used and unused interconnect lines at the first logic level; configuring the PLD with the used interconnect lines being driven to a second logic level different from the first logic level and the unused interconnect lines being driven to the first logic level; measuring a total current IDDQtot with the used interconnect lines at the second logic level and the unused interconnect lines at the first logic level; determining a signature current IDDQsig equal to a difference between the IDDQtot and the IDDQref; rejecting the PLD for the design if the IDDQsig exceeds a predetermined threshold; and passing the PLD for the design if the IDDQsig does not exceed the predetermined threshold.

BRIEF DESCRIPTION OF THE DRAWINGS

The present invention is illustrated by way of example, and not by way of limitation, in the following figures.

DETAILED DESCRIPTION OF THE DRAWINGS

Figure 1:
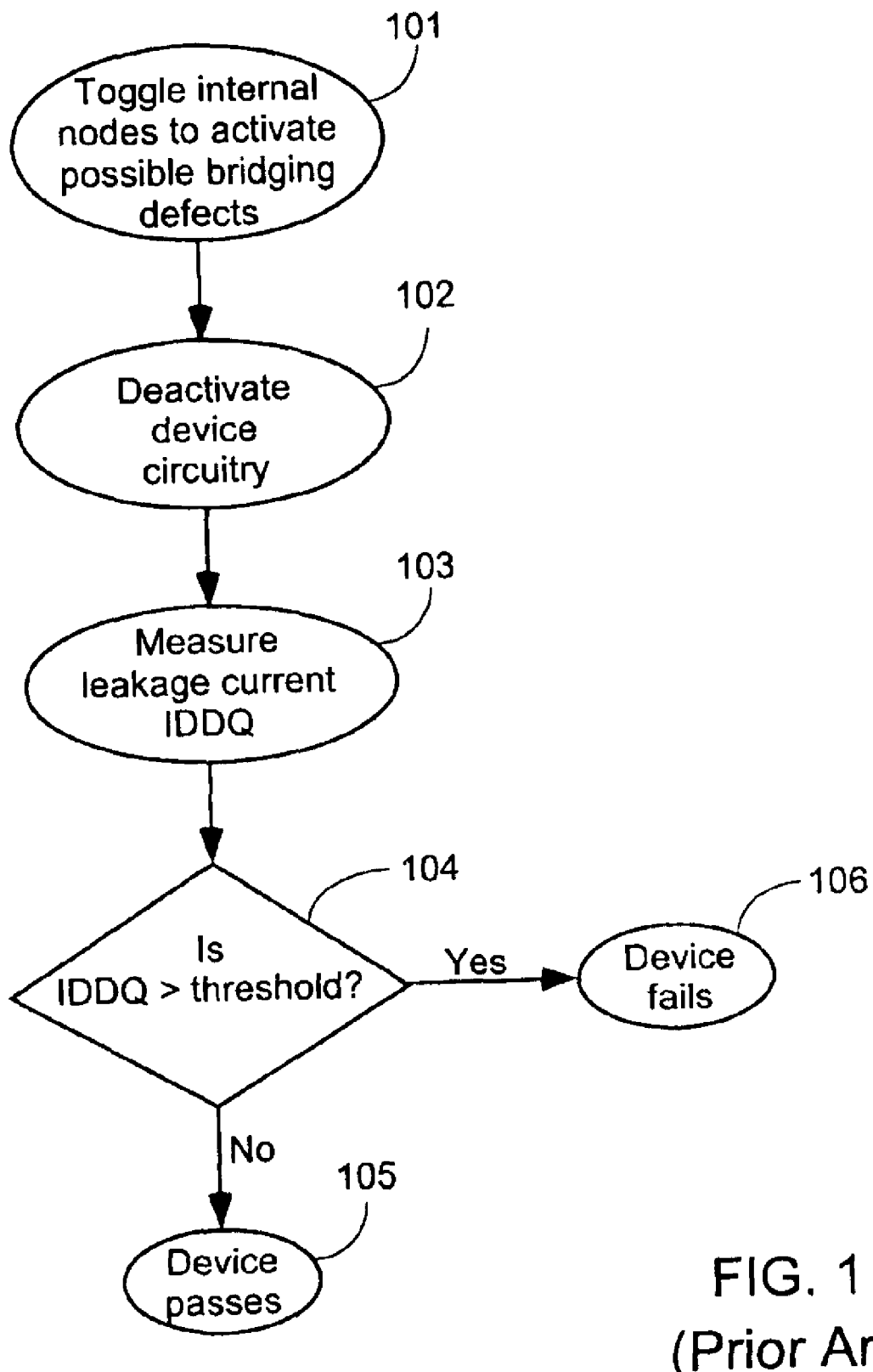
FIG. 1 shows the steps of a known method of testing for shorts in a device using quiescent leakage.

The present invention is believed to be applicable to a variety of devices. The present invention has been found to be particularly applicable and beneficial for testing for bridging defects between used and unused interconnect lines in a design targeted to a programmable logic device (PLD). While the present invention is not so limited, an appreciation of the present invention is presented by way of specific examples, in this instance an example of testing a partially defective field programmable gate array (FPGA) for compatibility with a design targeted to the FPGA.

It has been proposed that partially defective FPGAs (e.g., FPGAs including localized defects) can be used to implement specific designs targeted to the FPGA that do not make use of the defective resources. For example, an FPGA that includes a bridging defect between two interconnect lines can be used for a design that does not use either of the two interconnect lines. As another example, in an FPGA where all unused interconnect lines are tied to a known value (e.g., power high or ground), a bridging defect between an unused interconnect line and another interconnect line driven to the same known value has no effect on the functionality of the design.

However, some bridging defects do render an FPGA unusable for certain specific designs. For example, in an FPGA where all unused interconnect lines are tied to a known value, a bridging defect between a used interconnect line (an interconnect line used in a design targeted to the FPGA) and an unused interconnect line (an interconnect line not used in the design) results in the used interconnect line being driven to the known value. Thus, the design fails to function properly if implemented in that particular FPGA.

Clearly, when testing specific designs in partially defective FPGAS, it is desirable to identify those bridging defects that will detrimentally affect the design, as opposed to those defects that are immaterial to the device design combination. For example, where unused interconnect lines are tied to power high, a bridging defect between an unused interconnect line and power high does not matter. However, if the wired-AND testing method were used, the unused interconnect line would be driven low, thereby creating a short between power high and ground. This short might not be detected by the testing process, in which case it would degrade device reliability. On the other hand, the short might be detected, in which case the FPGA would be rejected as being unsuitable for use with the design. However, if the unused interconnect line were tied to power high for testing, the design would have been considered suitable. Therefore, the wired-AND testing method has unnecessarily reduced the product yield.

Clearly, in an FPGA designed to tie all unused interconnect lines to a logic high value, it is preferable not to use testing methods that drive unused interconnect lines to a logic low value. Therefore, alternate methods of detecting bridging defects are generally used.

FIG. 1 illustrates the steps of a known method of detecting bridging defects in integrated circuits (ICs). This method is referred to herein as the "quiescent leakage test". The quiescent leakage test is based on the generally accurate assumption that bridging defects cause excessive current to flow. Therefore, the test first attempts to activate any existing bridging defects, then measures the quiescent leakage current. Excessive current indicates the presence of a bridging defect.

In step 101, the internal nodes are toggled to place them in the proper state to activate possible bridging defects. In step 102, all active circuitry is deactivated so there is no active current consumption. For example, no oscillators are running, and no charge pump or direct current (DC) paths are active.

Steps 101 and 102 can be performed at the same time. Typically, scan chains are used to set up the internal nodes into the proper state, and automated test vector generators ensure that the internal nodes are properly set to activate any bridging defects.

In step 103, the leakage current IDDQ is measured for the IC. In step 104, the measured leakage current IDDQ is compared to a predetermined threshold (i.e., the "normal" leakage current). If IDDQ does not exceed the threshold, it is assumed that the IC does not include bridging defects, and the device passes (condition 105). If IDDQ is greater than the threshold, it is assumed that the IC includes bridging defects, and the device fails (condition 106).

As process geometries have become smaller over time, the quiescent leakage test has become less reliable. In particular, the quiescent leakage test requires that the defective, devices have a leakage current that clearly stands out from the "normal" devices. In other words, the difference between the normal and defective leakage currents must be reasonably large in order to detect a defect. With today's smaller geometries, the extra leakage from a single bridging defect can be lost in the large amount of normal leakage. Further, there is variability between the different IC wafer lots that makes it difficult to determine a normal leakage current that applies to all tested devices. For these reasons, the quiescent leakage test has diminished effectiveness in the newer process technologies.

To overcome these limitations, the semiconductor industry has reacted by devising more complex methods using statistical techniques to estimate the normal leakage current. These statistical techniques can require extensive research and do not necessarily overcome the limitations described above.

One type of IC in which leakage current is typically high is the programmable logic device (PLD). A PLD typically includes many transistors that are not used in a given design. However, these transistors still contribute to the normal leakage current of the PLD. Therefore, the leakage current due to a bridging defect is much less than the normal leakage current. This characteristic is even more of an issue when partially defective PLDs are used to implement designs, as previously described. In a partially defective PLD, bridging defects in unused areas of the PLD are acceptable and should be considered as part of the normal leakage current. Therefore, determining the normal level can be quite difficult in these circumstances.

The invention provides new methods of testing for shorts between two sets of interconnect lines in ICs. For example, some embodiments provide methods of testing for shorts between used and unused interconnect lines for a design targeted to a partially defective PLD. The new methods do not require the determination of a blanket normal leakage current that will be applied to all devices, as in known methods. Instead, a signature leakage current IDDQsig is determined for each device or device design combination, and the signature leakage current is used as the threshold value for the device or device design combination.

Figure 2:
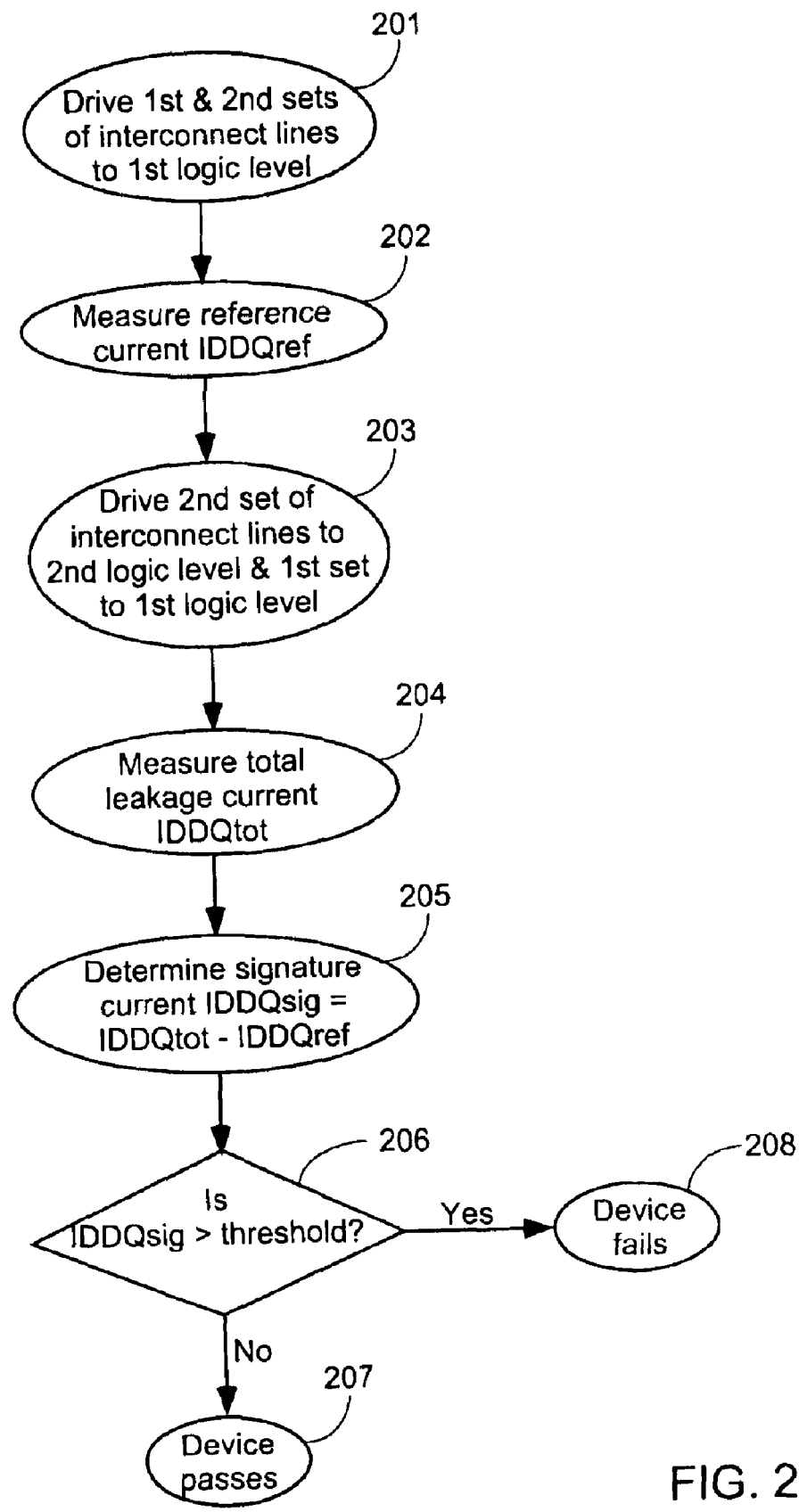
FIG. 2 shows the steps of a method of detecting shorts between first and second sets of interconnect lines in a device, according to an embodiment of the present invention.

FIG. 2 illustrates the steps of a method of detecting shorts between first and second sets of interconnect lines in a device, according to an embodiment of the present invention. In some embodiments, the device is a PLD, and in some of these embodiments the PLD is an FPGA. In some embodiments, the device is a partially defective FPGA to which a design has been targeted. In some embodiments, the illustrated steps are applied to a PLD in which no defects have yet been detected. In some embodiments, the PLD has no defects.

In step 201, first and second sets of interconnect lines in the device are driven to a first logic level. In some embodiments, where the device is a PLD to which a design has been targeted, the first set of interconnect lines is the set of interconnect lines unused by the design, and the second set of interconnect lines is the set of interconnect lines used by the design. In some embodiments, the first logic level is a logic high level.

In some embodiments, the first and second sets of interconnect lines are sets of alternating interconnect lines. In other words, within an adjacent group of interconnect lines, one set includes the first, third, fifth lines, and so forth, while the other set includes the second, fourth, sixth lines, and so forth. These embodiments can be used to detect bridging defects in most devices, because only interconnect lines that are at least partially adjacent are susceptible to bridging defects. These embodiments can be used, for example, for testing groups of adjacent "hex", "double", or "long" interconnect lines in the Virtex™ families of FPGAs from Xilinx, Inc.

In some embodiments, where the device is a PLD, driving the first and second sets of interconnect lines to the first logic level is performed by configuring the PLD with a first configuration bitstream. In some embodiments, wherein the device is a PLD to which a design has been targeted, and the first and second sets of interconnect lines are the unused and used interconnect lines, respectively, the unused interconnect lines are driven to the first logic level by default. For example, in the FPGAS from Xilinx, Inc., unused interconnect lines are driven to a logic high value by default by the configuration bitstream generation software, BitGen.

In step 202, the leakage current is measured with both sets of interconnect lines at the first logic level. This measured leakage current is the reference current IDDQref. Because both sets of interconnect lines are at the first logic level, a short between lines of the two groups does not contribute any current to the measured reference current IDDQref.

In step 203, the second set of interconnect lines is driven to a second logic level different from the first logic level. The first set of interconnect lines is driven to the first logic level.

In some embodiments, the first logic level is power high and the second logic level is ground. At this point, the two sets of interconnect lines are at two different logic levels. Therefore, a short between a first interconnect line in the first set and a second interconnect line in the second set (e.g., a bridging defect) results in a current flow between the two interconnect lines and causes an increased leakage current.

In step 204, the leakage current is measured again with the first set of interconnect lines at the first logic level and the second set of interconnect lines at the second logic level. This measured leakage current is the total leakage current IDDQtot. The total leakage current IDDQtot is always greater than the reference current IDDQref, because there is leakage between the first and second sets of interconnect lines that are being driven to different logic levels. The presence of a short between interconnect lines in the two sets increases IDDQtot by a fault current, IDDQfault.

Step 201 precedes step 202, and step 203 precedes step 204. However, steps 201–202 can be performed before or after steps 203–204.

In step 205, the difference between the total leakage current IDDQtot and the reference current IDDQref is determined. This difference is called the signature current, IDDQsig. The signature current IDDQsig is generally much less than the reference current IDDQref. For non-defective devices, the signature current IDDQsig measures the difference in leakage current when the second set of interconnect lines are driven to the first and second logic levels. For defective devices, the signature current IDDQsig measures the difference in leakage current when the second set of interconnect lines are driven to the first and second, logic levels, plus the excess current caused by the short (the fault current IDDQfault). Thus, a high signature current IDDQsig signifies the presence of shorts between the two sets of interconnect lines.

In step 206, the signature current IDDQsig is compared to a predetermined threshold. If IDDQsig does not exceed the threshold, it is assumed that the device does not include shorts between the first and second sets of interconnect lines, and the device passes (condition 207). If IDDQsig is greater than the threshold, it is assumed that the device includes shorts between the first and second sets of interconnect lines, and the device is rejected (condition 208).

A particularly useful application of the present invention is when the device being tested is a PLD. In a PLD, it is usually fairly simple to drive selected interconnect lines to known values (e.g., as in steps 201 and 203 of FIG. 2) by configuring the PLD. In some embodiments, where the PLD is an FPGA, the interconnect lines are driven to known values by setting the states of the registers contained within the various logic blocks of the FPGA. This is easily done in Xilinx FPGAs, for example, by setting initialization values prior to generating a configuration bitstream, e.g., using the INITX and LUT:D=x values within an XDL (Xilinx Description Language) representation of a particular FPGA configuration.

In some embodiments, the methods of the invention address the situation where a partially defective PLD has been targeted by a design. For example, suppose a PLD includes a bridging defect between two interconnect lines. This partially defective PLD cannot be used for any design that uses either of the two interconnect lines involved in the bridging defect. However, the PLD can be used for a design that does not use either of the two interconnect lines associated with the defect. Hence, it is desirable to check the PLD for shorts between any of the interconnect lines used by the design-and any of the interconnect lines not used by the design.

Figure 3:
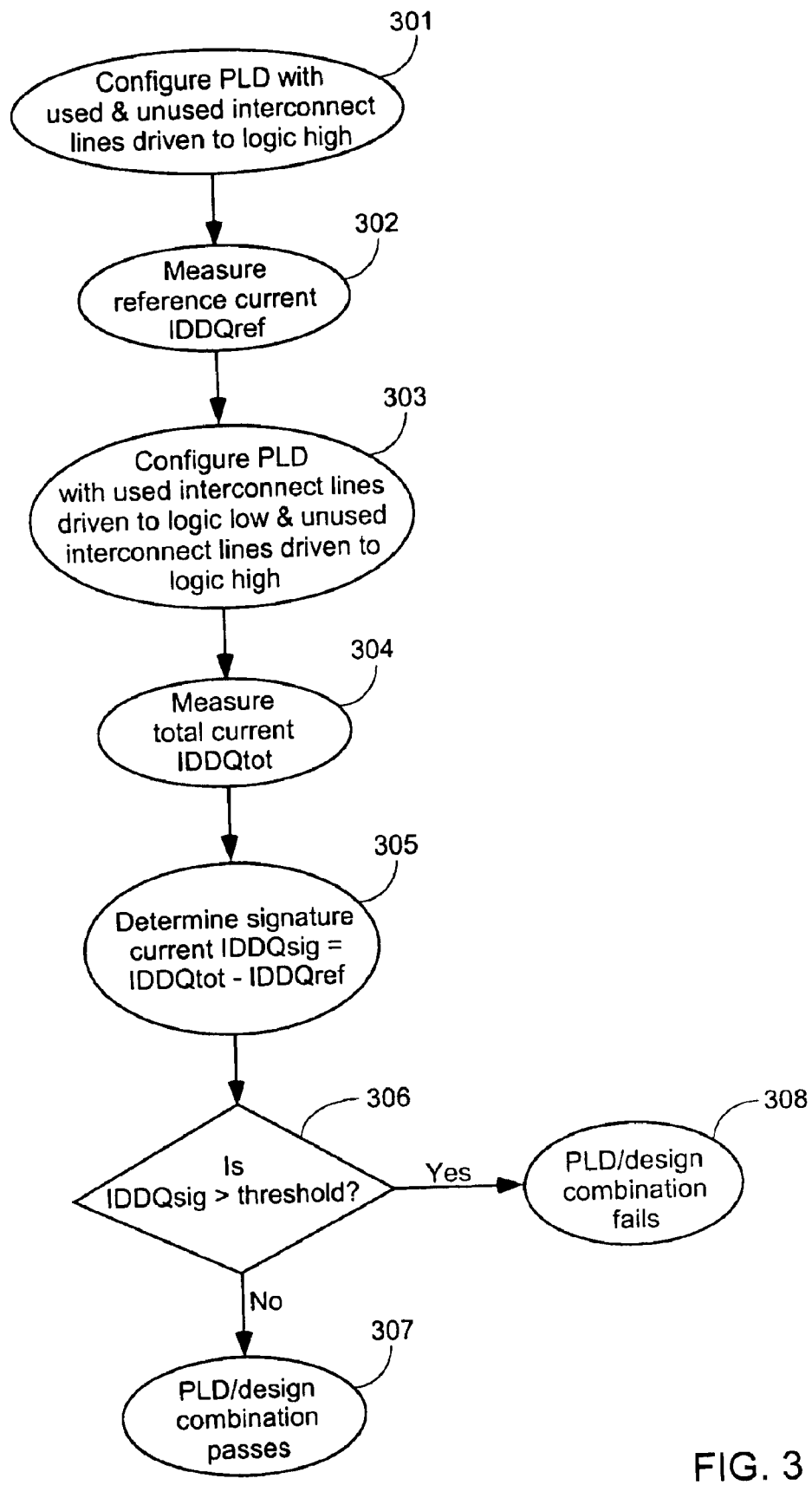
FIG. 3 shows the steps of a method of detecting shorts between used and unused interconnect lines in a design targeted to a PLD, according to another embodiment of the present invention.

FIG. 3 illustrates the steps of an embodiment of the invention that can be used to address this situation.

Specifically, FIG. 3 illustrates the steps of a method of detecting shorts between used and unused interconnect lines in a design targeted to a PLD. In some embodiments, the PLD is an FPGA. In other embodiments the PLD is another type of reconfigurable device, e.g., a CPLD or other PLD. In some embodiments, the PLD is known to be partially defective, while in other embodiments the illustrated steps are applied to a PLD in which no defects have been detected.

In step 301, the PLD is configured (e.g., with a first configuration bitstream) such that both used and unused interconnect lines are driven to a first logic level. In some embodiments, the first logic level is a logic high level. In some embodiments, the unused interconnect lines are driven to the first logic level by default. For example, in the FPGAs from Xilinx, Inc., unused interconnect lines are driven to a logic high value by default by the configuration bitstream generation software, BitGen.

In step 302, the leakage current is measured. This measured leakage current is the reference current IDDQref. Because both used and unused interconnect lines are at the first logic level, a short between a used and an unused interconnect line does not contribute any current to the measured reference current IDDQref.

In step 303, the PLD is reconfigured (e.g., with a second configuration bitstream) such that the used interconnect lines are driven to a second logic level different from the first logic level. The unused interconnect lines are driven to the first logic level. In some embodiments, the first logic level is a logic high level and the second logic level is ground. At this point, the used and unused interconnect lines are at two different logic levels. Therefore, a short between a used interconnect line and an unused interconnect line (e.g., a bridging defect) results in a current flow between the two interconnect lines and causes an increased leakage current.

In step 304, the leakage current is measured again. This measured leakage current is the total current IDDQtot. The total leakage current IDDQtot is always greater than the reference current IDDQref, because there is leakage between the used and unused interconnect lines that are being driven to different logic levels. The presence of a short between used and unused interconnect lines increases IDDQtot by a fault current, IDDQfault.

Step 301 precedes step 302, and step 303 precedes step 304. However, steps 301–302 can be performed before or after steps 303–304.

In step 305, the difference between the total leakage current IDDQtot and the reference current IDDQref is determined. This difference is called the signature current, IDDQsig. The signature current IDDQsig is generally much less than the reference current IDDQref. For non-defective devices, the signature current IDDQsig measures the difference in leakage current when the used interconnect lines are driven to the first and second logic levels. For defective devices, the signature current IDDQsig measures the difference in leakage current when the used interconnect lines are driven to the first and second voltage levels, plus the excess current caused by the short (the fault current IDDQfault). Thus, a high signature current IDDQsig signifies the presence of shorts between the used and unused interconnect lines.

In step 306, the signature current IDDQsig is compared to a predetermined threshold. If IDDQsig does not exceed the threshold, it is assumed that the PLD does not include shorts between the used and unused interconnect lines, and the device passes (condition 307). If IDDQsig is greater than the threshold, it is assumed that the device includes shorts between the used and unused interconnect lines, and the device is rejected (condition 308).

Note that both the prior art method of FIG. 1 and the methods of the invention require a predetermined threshold current level. This threshold current level is typically estimated or measured indirectly, independent of the device currently being tested. However, the methods of the invention offer a significant advantage over the prior art method. Typically, the signature current IDDQsig (FIGS. 2, 3) is a much smaller value than the reference current IDDQ (FIG. 1). Therefore, the comparison of the signature current to a threshold value (steps 206, 306) is more accurate than the comparison of the reference current IDDQ to a threshold value (step 104). Relatively small current variations caused by shorts are more easily detected using the methods of the invention.

Another advantage of the methods of the invention is that the comparison between the total and reference currents is preferably performed for each device individually. In embodiments where the device is a partially defective PLD targeted by a design, the comparison between the total and reference currents is preferably performed for each PLD design combination. Therefore, systemic variations (such as variations with wafer lot) are reduced or eliminated.

For larger devices with very small process geometries, it can be desirable to take further steps to improve the described methods. A larger device results in larger leakage current, e.g., larger values of the reference current IDDQref and the total current IDDQtot. However, larger PLDs typically include a higher proportion of interconnect lines than smaller devices. Therefore, the total current IDDQtot increases at a faster rate than the reference current IDDQref, because of the larger number of interconnect lines that contribute to the leakage between the two sets of interconnect lines. Further, the shrinking of process geometries contributes more to the total current IDDQtot than to the reference current IDDQref. Thus, the total current IDDQtot increases at a faster rate than the reference current IDDQref, potentially masking the fault current IDDQfault.

One way to mitigate these effects is to measure the total current IDDQtot for various subsets of the device, rather than for the entire device at one time. This technique reduces the value of IDDQtot for each separate measurement. Therefore, the value of IDDQsig is reduced.

For example, applying this modified technique to the embodiment of FIG. 3, the used interconnect lines of the design can be partitioned into N groups. Preferably, the interconnect lines of the design are sufficiently partitioned to eliminate the dependence on device and process geometry sizes. Also, preferably each used interconnect line is included in at least one of the groups.

If desired, steps 301 and 302 can be performed only once for the PLD. Steps 303–308 are then performed sequentially for each of the N groups, resulting in N signature current values and N pass-fail decisions. In some embodiments, the amount of test time scales linearly with the number of groups, as each group is tested following the same procedure. In some embodiments, the first fail decision (condition 308) results in the rejection of the PLD design combination, and the testing is terminated for that combination.

when this modified procedure is followed, in step 303 only a subset of the interconnect lines utilized by the design are driven to a logic low value for the group. In other words, the "used interconnect lines" are only a subset of the interconnect lines utilized by the design. In step 304, a total current value IDDQtot_x is measured for the group. In step 305, a separate signature current IDDQsig_x is measured for the group, where "x". references the subset currently being tested. Each signature current IDDQsig_x is lower than the signature current IDDQsig for the entire design, and therefore more accurately tests for shorts between the used interconnect lines in the group and the unused interconnect lines. Each signature current value has its own threshold, and the N threshold values can be the same or can be different from each other.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the methods of the invention in the context of programmable logic devices (PLDs) such as field programmable gate arrays (FPGAs). In particular, the methods of the invention are applied by example to partially defective FPGAs targeted for use with a design that utilizes only a portion of the available interconnect lines. However, the methods of the invention can also be applied to other integrated circuits (ICs), including non-programmable devices, partially programmable devices, and PLDs other than FPGAs. Further, the methods of the invention can be applied to fully functional devices.

Accordingly, all such modifications and additions are deemed to be within the scope of the invention, which is to be limited only by the appended claims and their equivalents.

What is claimed is:

1. A method of detecting shorts between first and second sets of interconnect lines in a device, the method comprising:

driving the first and second sets of interconnect lines to a first logic level;

measuring a reference current IDDQref with the first and second sets of interconnect lines at the first logic level;

driving the first set of interconnect lines to the first logic level and the second set of interconnect lines to a second logic level different from the first logic level;

measuring a total leakage current IDDQtot with the first set of interconnect lines at the first logic level and the second set of interconnect lines at the second logic level;

determining a signature current IDDQsig equal to a difference between the IDDQtot and the IDDQref;

rejecting the device if the IDDQsig exceeds a predetermined threshold; and passing the device if the IDDQsig does not exceed the predetermined threshold.

2. The method of claim 1, wherein the first logic level is power high and the second logic level is ground.

3. The method of claim 1, wherein the device is a programmable logic device (PLD).

4. The method of claim 3, wherein:

driving the first and second sets of interconnect lines to a first logic level comprises configuring the PLD with a first configuration bitstream; and driving the first set of interconnect lines to the first logic level and the second set of interconnect lines to a second logic level comprises configuring the PLD with a second configuration bitstream.

5. The method of claim 3, wherein the PLD is a field programmable gate array (FPGA).

6. The method of claim 3, wherein the PLD is partially defective.

7. The method of claim 3, wherein:

the first set of interconnect lines comprises interconnect lines unused in a PLD design targeted to the PLD; and the second set of interconnect lines comprises interconnect lines used in the PLD design.

8. The method of claim 7, wherein the unused interconnect lines are driven to the first logic level by default.

9. The method of claim 1, wherein the first and second sets of interconnect lines comprise sets of alternating interconnect lines within a group of physically adjacent interconnect lines in the device.

10. The method of claim 1, wherein the steps of the method are performed in the order shown.

11. A method of detecting shorts between used and unused interconnect lines in a design targeted to a programmable logic device (PLD), the method comprising:

configuring the PLD with both used and unused interconnect lines being driven to a first logic level, the used interconnect lines being interconnect lines in the PLD used in the design and the unused interconnect lines being interconnect lines in the PLD not used by the design;

measuring a reference current IDDQref with both used and unused interconnect lines at the first logic level;

configuring the PLD with the used interconnect lines being driven to a second logic level different from the first logic level and the unused interconnect lines being driven to the first logic level;

measuring a total current IDDQtot with the used interconnect lines at the second logic level and the unused interconnect lines at the first logic level;

determining a signature current IDDQsig equal to a difference between the IDDQtot and the IDDQref;

rejecting the PLD for the design if the IDDQsig exceeds a predetermined threshold; and passing the PLD for the design if the IDDQsig does not exceed the predetermined threshold.

12. The method of claim 11, wherein the used interconnect lines comprise a subset of interconnect lines in the PLD that are utilized by the design.

13. The method of claim 11, wherein the first logic level is power high and the second logic level is ground.

14. The method of claim 11, wherein the PLD is a field programmable gate array (FPGA).

15. The method of claim 11, wherein the PLD is partially defective.

16. The method of claim 11, wherein the unused interconnect lines are driven to the first logic level by default.

17. The method of claim 11, wherein the steps of the method are performed in the order shown.

18. A computer-readable storage medium comprising computer-executable code for detecting shorts between first and second sets of interconnect lines in a device, the medium comprising:

code for driving the first and second sets of interconnect lines to a first logic level;

code for driving the first set of interconnect lines to the first logic level and the second set of interconnect lines to a second logic level different from the first logic level;

code for measuring a reference current IDDQref with the first and second sets of interconnect lines at the first logic level, and measuring a total leakage current IDDQtot with the first set of interconnect lines at the first logic level and the second set of interconnect lines at the second logic level;

code for determining a signature current IDDQsig equal to a difference between the IDDQtot and the IDDQref; and code for rejecting the device if the IDDQsig exceeds a predetermined threshold, and passing the device if the IDDQsig does not exceed the predetermined threshold.

19. The computer-readable storage medium of claim 18, wherein:

the device is a programmable logic device (PLD);

the code for driving the first and second sets of interconnect lines to a first logic level comprises a first configuration bitstream for the PLD; and the code for driving the first set of interconnect lines to the first logic level and the second set of interconnect lines to a second logic level comprises a second configuration bitstream for the PLD.

20. The computer-readable storage medium of claim 18, wherein the first and second sets of interconnect lines comprise sets of alternating interconnect lines within a group of physically adjacent interconnect lines in the device.

21. A computer-readable storage medium comprising computer-executable code for detecting shorts between used and unused interconnect lines in a design targeted to a programmable logic device (PLD), the medium comprising:

code for configuring the PLD with both used and unused interconnect lines being driven to a first logic level, the used interconnect lines being interconnect lines in the PLD used in the design and the unused interconnect lines being interconnect lines in the PLD not used by the design;

code for configuring the PLD with the used interconnect lines being driven to a second logic level different from the first logic level and the unused interconnect lines being driven to the first logic level;

code for measuring a reference current IDDQref with both used and unused interconnect lines at the first logic level, and measuring a total current IDDQtot with the used interconnect lines at the second logic level and the unused interconnect lines at the first logic level;

code for determining a signature current IDDQsig equal to a difference between the IDDQtot and the IDDQref; and code for rejecting the PLD for the design if the IDDQsig exceeds a predetermined threshold, and passing the PLD for the design if the IDDQsig does not exceed the predetermined threshold.

22. A computer system for detecting shorts between first and second sets of interconnect lines in a device, the computer system comprising:

a first driving module for driving the first and second sets of interconnect lines t o a first logic level;

a second driving module for driving the first set of interconnect lines to the first logic level and driving the second set of interconnect lines to a second logic level different from the first logic level;

a current measuring module for measuring a reference current IDDQref with the first and second sets of interconnect lines at the first logic level, and for measuring a total leakage current IDDQtot with the first set of interconnect lines at the first logic level and the second set of interconnect lines at the second logic level;

a signature current determining module for determining a signature current IDDQsig equal to a difference between the IDDQtot and the IDDQref; and an evaluation module for rejecting the device if the IDDQsig exceeds a predetermined threshold and passing the device if the IDDQsig does not exceed the predetermined threshold.

23. The computer system of claim 22, wherein:

the device is a programmable logic device (PLD);

the first driving module comprises a first configuration bitstream for the PLD; and the second driving module comprises a second configuration bitstream for the PLD.

24. The computer system of claim 22, wherein the first and second sets of interconnect lines comprise sets of alternating interconnect lines within a group of physically adjacent interconnect lines in the device.

25. A computer system for detecting shorts between used and unused interconnect lines in a design targeted to a programmable logic device (PLD), the computer system comprising:

a first configuring module for configuring the PLD with both used and unused interconnect lines being driven to a first logic level, the used interconnect lines being interconnect lines in the PLD used in the design and the unused interconnect lines being interconnect lines in the PLD not used by the design;

a second configuring module for configuring the PLD with the used interconnect lines being driven to a second logic level different from the first logic level and the unused interconnect lines being driven to the first logic level;

a current measuring module for measuring a reference current IDDQref with the used and unused interconnect lines at the first logic level, and measuring a total current IDDQtot with the unused interconnect lines at the first logic level and the used interconnect lines at the second logic level;

a signature current determining module for determining a signature current IDDQsig equal to a difference between the IDDQtot and the IDDQref; and an evaluation module for rejecting the PLD for the design if the IDDQsig exceeds a predetermined threshold, and passing the PLD for the design if the IDDQsig does not exceed the predetermined threshold.

* * * * *